(12) United States Patent
Giral et al.

(10) Patent No.: US 7,099,792 B2
(45) Date of Patent: Aug. 29, 2006

(54) SYNCHRONIZATION OF MULTIPLE TEST INSTRUMENTS

(75) Inventors: Frederic Giral, Pourcieux (FR); Jean-Claude Fournel, St Didier en Velay (FR)

(73) Assignee: Credence Systems Corporation, Milpitas, CA (US)

( * ) Notice: Subject to any disclaimer, the term of this patent is extended or adjusted under 35 U.S.C. 154(b) by 34 days.

(21) Appl. No.: 10/956,549

(22) Filed: Oct. 1, 2004

(65) Prior Publication Data

US 2006/0074584 A1    Apr. 6, 2006

(51) Int. Cl.
*G01M 19/00*    (2006.01)
*G01L 15/00*    (2006.01)
*G06F 11/00*    (2006.01)

(52) U.S. Cl. ............... 702/123; 702/121; 702/152; 714/704; 714/707

(58) Field of Classification Search ............... 702/123, 702/121, 117, 125; 714/704, 707
See application file for complete search history.

(56) References Cited

U.S. PATENT DOCUMENTS

| 4,849,702 A | * | 7/1989 | West et al. ............... 327/160 |
| 6,067,648 A | * | 5/2000 | Hunter et al. ............ 714/718 |
| 2003/0105607 A1 | | 6/2003 | Jones et al. | |

* cited by examiner

*Primary Examiner*—Bryan Bui
*Assistant Examiner*—Meagan S Walling

(57) ABSTRACT

A test apparatus has multiple instruments that are synchronized with respect to one another so that test data generated by them arrive at the pins of a device under test at the time specified in a test program. The synchronization of the multiple instruments is carried out by introducing delays to triggers that are generated and used by the multiple instruments. The amount of delay that is introduced varies from instrument to instrument and is based on differences in the actual transmission and processing delays and clock rates.

18 Claims, 9 Drawing Sheets

SYNCHRONIZATION OF MULTIPLE TEST INSTRUMENTS

BACKGROUND OF THE INVENTION

1. Field of the Invention

The present invention relates generally to electronic device testing, and more particularly, to synchronization techniques used in testing integrated circuit (IC) devices with a test apparatus that has multiple instruments.

2. Description of the Related Art

A test system having a multiple instrument platform represents a significant advance in the art. One example of such a test system is described in U.S. patent application Ser. No. 10/222,191, entitled "Circuit Testing with Ring-Connected Test Instrument Modules," filed Aug. 16, 2002, the entire contents of which are incorporated by reference herein.

In this test system 100, illustrated in FIG. 1, a test head interface module 110 and a plurality of instruments (collectively referred to as 120; individually referred to as instrument A, instrument B, and instrument C) are connected together over a ring bus 130. The test head interface module 110 houses a global clock 140 to which all of the instruments 120 are synchronized.

During testing, the test system 100 operates under the control of software, e.g., a test program. The test program specifies the test patterns to be supplied to a device under test (DUT) 150, the expect data patterns to be compared with the response signals from the DUT 150, and timing information indicating when the test patterns are to be supplied and when the response signals are to be strobed.

With a multiple instrument platform, the designer of a test has the flexibility to simultaneously test different pins of the DUT 150 with different test patterns and to condition the triggering of this test with respect to certain programmed events or certain events detected at the DUT 150. In addition, the test system having a multiple instrument platform is able to accommodate testing of pins at different clock rates. For example, if the core part of the DUT 150 operates at 250 MHz and other parts of the DUT 150 operates at 100 MHz, the pins corresponding to the core part are tested with instruments running at 250 MHz and the pins corresponding to the other parts are tested with instruments running at 100 MHz.

In order for the triggering across different instruments to be carried out accurately, the instruments must be synchronized with respect to each other so that the test data generated by the instruments arrive at the pins of the DUT 150 at the time specified in the test program. The synchronization of the instruments with respect to the global clock ensures that trigger processing begins at the same time at each instrument, but this is not sufficient for synchronizing the instruments with respect to each other because: (i) the delays associated with the hardware overhead during trigger generation and reception differ from instrument to instrument; (ii) the instruments exhibit different pipeline delays; and (iii) the instruments may operate at different clock rates.

SUMMARY OF THE INVENTION

The invention provides a synchronization method for a test apparatus with multiple instruments that ensures that the test data generated by the different instruments arrive at the pins of a device under test at the time specified in the test program.

According to an embodiment of the invention, the test apparatus has a plurality of test instruments or modules that are connected to a bus and responsive to a trigger transmitted on the bus. A first one of these modules includes a programmable device that is programmed to execute a test sequence including a conditional part that is not executed until the trigger is received over the bus and to delay the execution of the conditional part after the trigger is received by a first delay amount that ensures that the test data generated upon execution of the conditional part arrive at the pins of the device under test at the time specified in the test program. A second one of these modules also includes a programmable device that is programmed to execute a test sequence including a conditional part that is not executed until the trigger is received over the bus and to delay the execution of the conditional part after the trigger is received by a second delay amount that ensures that the test data generated upon execution of the conditional part arrive at the pins of the device under test at the time specified in the test program.

The difference between the first delay amount and the second delay amount may be attributable to a difference in the pipeline delays of the two modules. When the test sequences executed by the programmable devices of the two modules have different test periods, the first delay amount and the second delay amount also include delays that ensure the test data generated by the two modules arrive at the device under test at the same time and at the beginning of their respective periods.

According to another embodiment of the invention, a test instrument or module for a test apparatus includes a first programmable device interfaced with a bus and a second programmable device coupled with the first programmable device and to a device under test. The second programmable device is programmed to execute a test sequence in response to a trigger received on the bus by the first programmable device at a rate equal to a clock speed of the device under test and to delay the trigger by a delay amount that is defined with respect to the clock speed of the device under test. For example, the delay amount is defined as the number of clock periods of the device under test.

Additional delays may be introduced by the test instrument. One such delay is an offset delay that is equal to a predetermined base delay minus an actual delay corresponding to hardware overhead related to providing a trigger request to the first programmable device. Another such delay is an offset delay that is equal to a predetermined base delay minus an actual delay corresponding to hardware overhead related to receiving a trigger from the first programmable device.

According to still another embodiment of the invention, a method of synchronizing the execution of test patterns by two test instruments or modules during testing of an electronic device includes the step of delaying a trigger for the two test instruments by their respective delay amounts to ensure that the test signals generated by the two instruments arrive at the pins of the device under test at the time specified in the test program.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not

DETAILED DESCRIPTION

Figure 1:
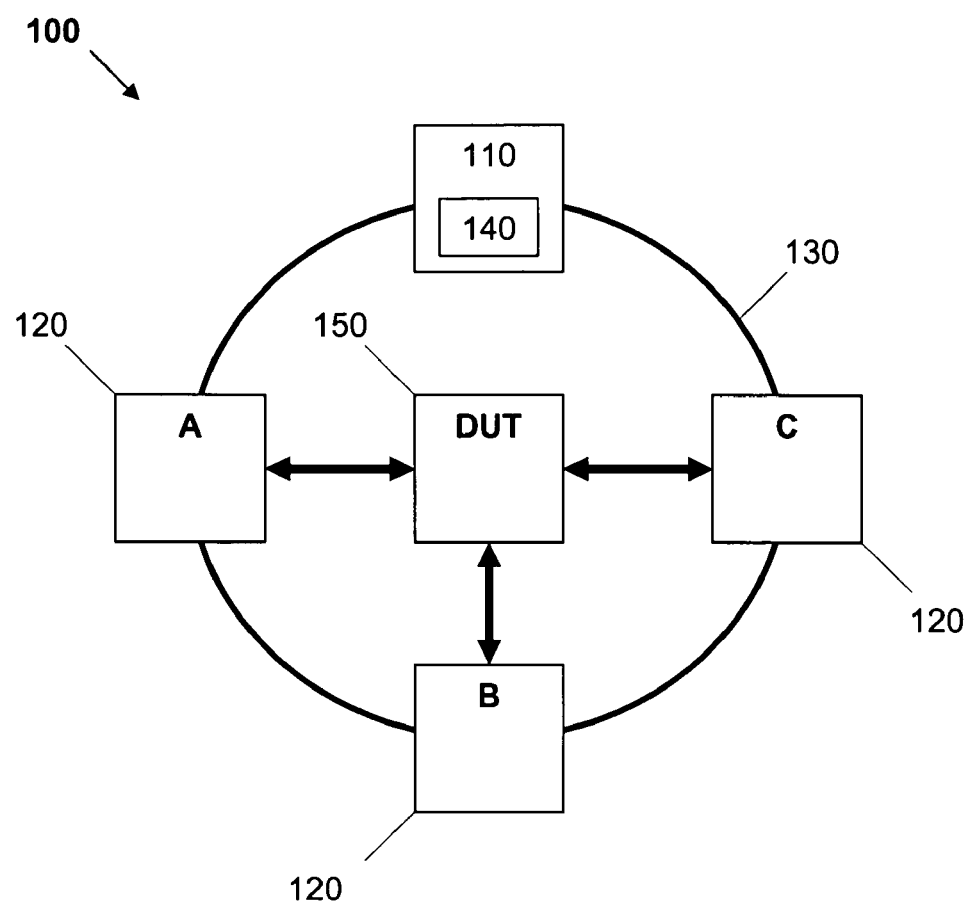
FIG. 1 is a block diagram of a test system having test instruments connected in a ring configuration.
Figure 2:
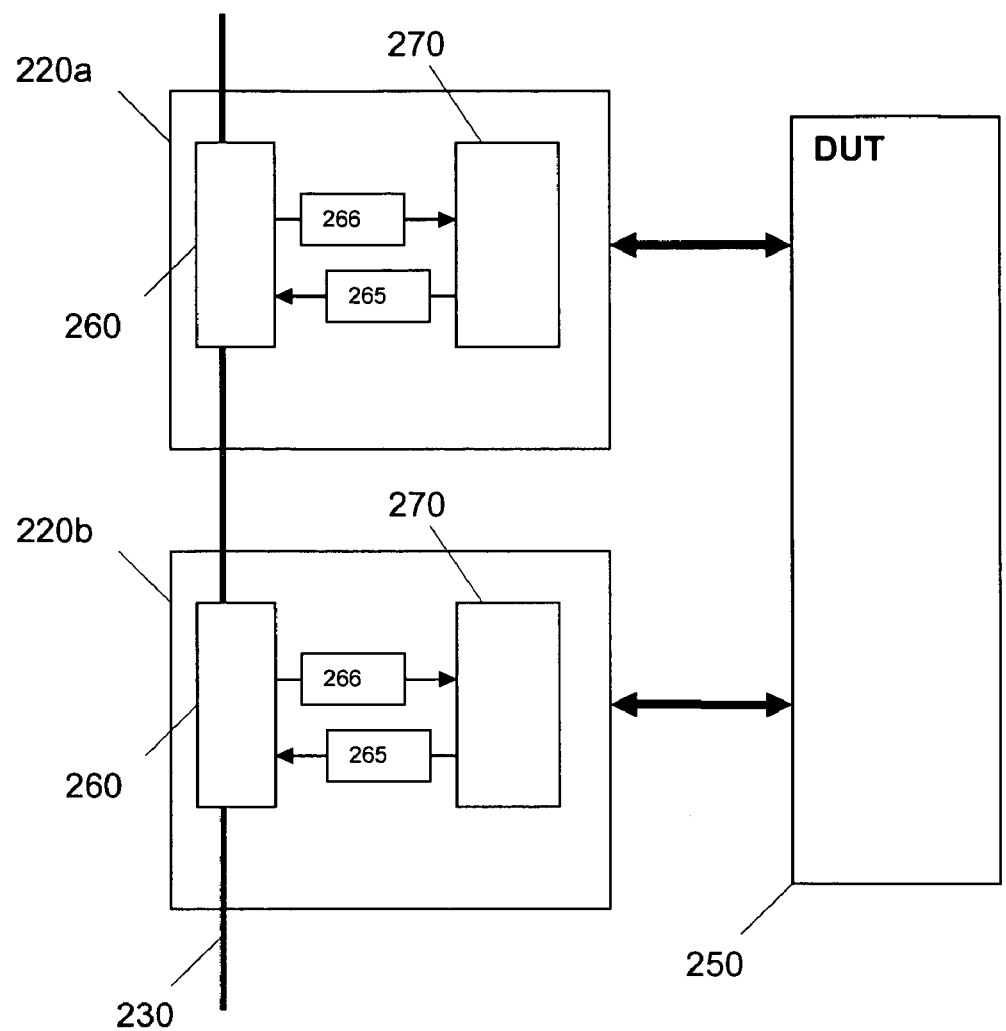
FIG. 2 is a block diagram showing two test instruments with offset delays.

FIG. 2 is a block diagram showing two test instruments or modules 220a, 220b of a test apparatus according to an embodiment of the invention. The test instrument 220a represents the test instrument that is generating a sync message and the test instrument 220b represents the test instrument that is receiving a sync message. Each of the test instruments 220a, 220b includes a bus interface FPGA 260 and a sequencer FPGA 270. The sequencer FPGA 270 of the test instrument 220a generates a request to generate a sync message and passes it onto the bus interface FPGA 260. The bus interface FPGA 260 generates the sync message in response to this request and passes it onto the ring bus 230. The sync message generated by the bus interface FGPA 260 is in the following format:

| 37 | 36 35 | 30 29 | 20 19 | 12 11 | 0 |
|---|---|---|---|---|---|
| 01 | Type | Clock | ResCount | Fine | | where:

Type=the sync type number;

Clock=Global Clock Number (GCN); GCN represents the clock number of the global clock to which the test instruments 220a, 220b are synchronized;

Rescount=a counter that is incremented each time the sync message passes through a test instrument and counts to a maximum of N, which is equal to the number corresponding to the number of test instruments that are connected together over the ring bus 230; when the counter returns to zero, the sync message is no longer passed onto the ring bus 230; and Fine=a time offset value indicating a time offset between the clock period of the DUT 250 and the clock period of the global clock at the time the sync generation is requested by the sequencer FPGA 270.

The bus interface FPGA 260 of the test instrument 220b receives the sync message from the ring bus 230 and passes it to the sequencer FPGA 270 when its GCN increments up to a number equal to the GCN specified in the sync message plus a fixed ring bus latency value. The sequencer FGPA 270 checks the sync type number specified in the sync message and if that number matches the sync type number that it is looking for, it accepts the sync message as its trigger.

In the process described above, it takes the hardware (the sequencer FPGA 270 and the bus interface FPGA 260 of 220a) a certain amount of time to generate the sync message, and the hardware (the bus interface FPGA 260 and the sequencer FPGA 270 of 220b) a certain amount of time to receive the sync message. This hardware overhead, however, differs from instrument to instrument. To account for this difference on the sync generation side, a delay (reqcsyncoffset) 265 is introduced so that all test instruments require the same amount of time to generate the sync message. To account for this difference on the sync reception side, a delay (csyncoffset) 266 is introduced so that all test instruments require the same amount of time to receive the sync message.

The delay on the sync generation side is calculated based on the following formula: reqcsyncoffset=(maximum delay on the sync generation side for all instruments−delay on the sync generation side for current instrument). The delay on the sync reception side is calculated based on the following formula: csyncoffset=(maximum delay on the sync reception side for all instruments−delay on the sync reception side for current instrument)+fixed ring bus latency value.

Figure 3:
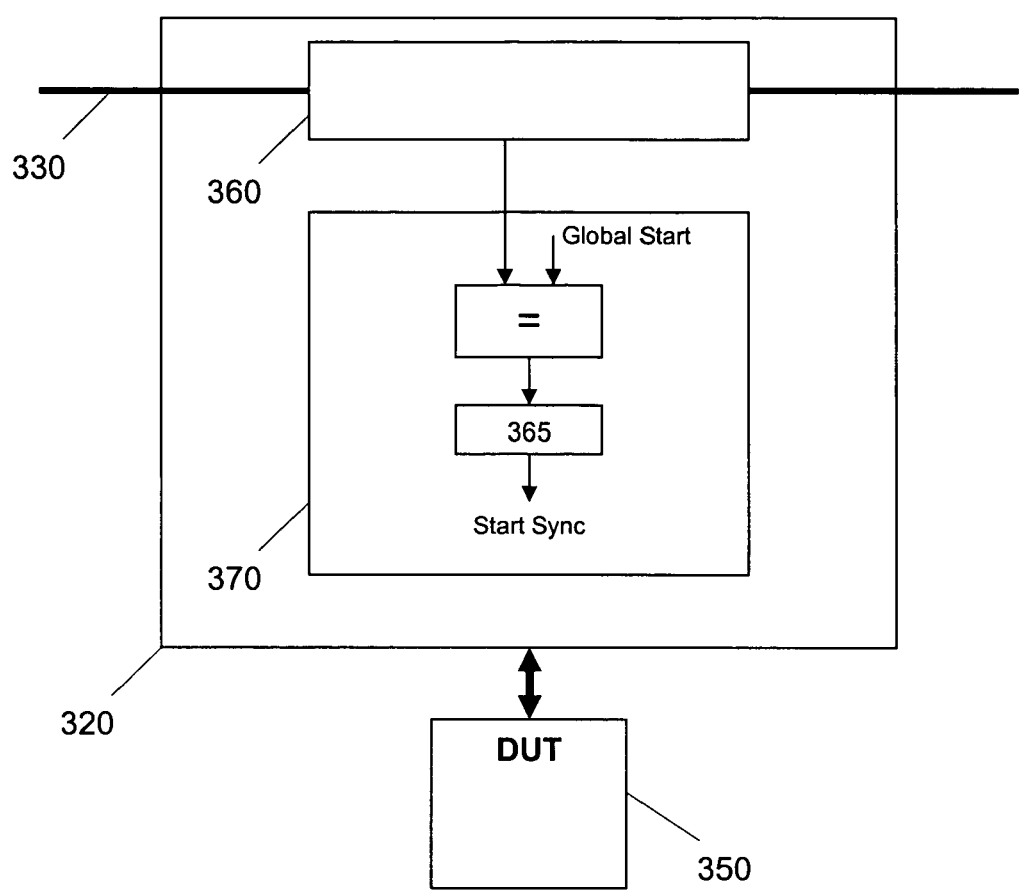
FIG. 3 is a block diagram showing a test instrument with an initial offset delay.

FIG. 3 is a block diagram showing a representative test instrument or module 320 of a test apparatus according to another embodiment of the invention. In this embodiment, a global sync message is issued by the test head interface module to initiate the testing of the DUT 350 (e.g., Type=0). The global sync message is passed around the ring bus 330 to each test instrument including the representative test instrument 320.

The bus interface FPGA 360 of the test instrument 320 receives the sync message from the ring bus 330 and passes it to the sequencer FPGA 370 when its GCN increments up to a number equal to the GCN specified in the sync message plus a fixed system latency value. The sequencer FGPA 370 checks the sync type number specified in the sync message, recognizes it as a global sync message for initiating the testing of the DUT 350, and initiates the testing of the DUT 350.

The time it takes for the sequencer FPGA 370 to initialize testing of the DUT 350 differs from instrument to instrument. To account for this difference, a delay (fteststartoffset) is introduced so that all test instruments begin testing of the DUT at the same time. This delay is calculated based on the following formula: fteststartoffset=(maximum initialization time for all instruments−initialization time for current instrument).

The delays that are introduced in the embodiments described above, reqcsyncoffset, csyncoffset and fteststartoffset, are delays that are clocked using the global clock. When these delays are used, sync messages appear at sequencer pipeline inputs of all instruments at the same time. According to additional embodiments of the invention, additional delays are introduced to account for differences in the sequencer pipeline delays among the instruments after the sequencer FPGA of the different instruments begin supplying data to the DUT at the DUT clock rate.

Figure 4:
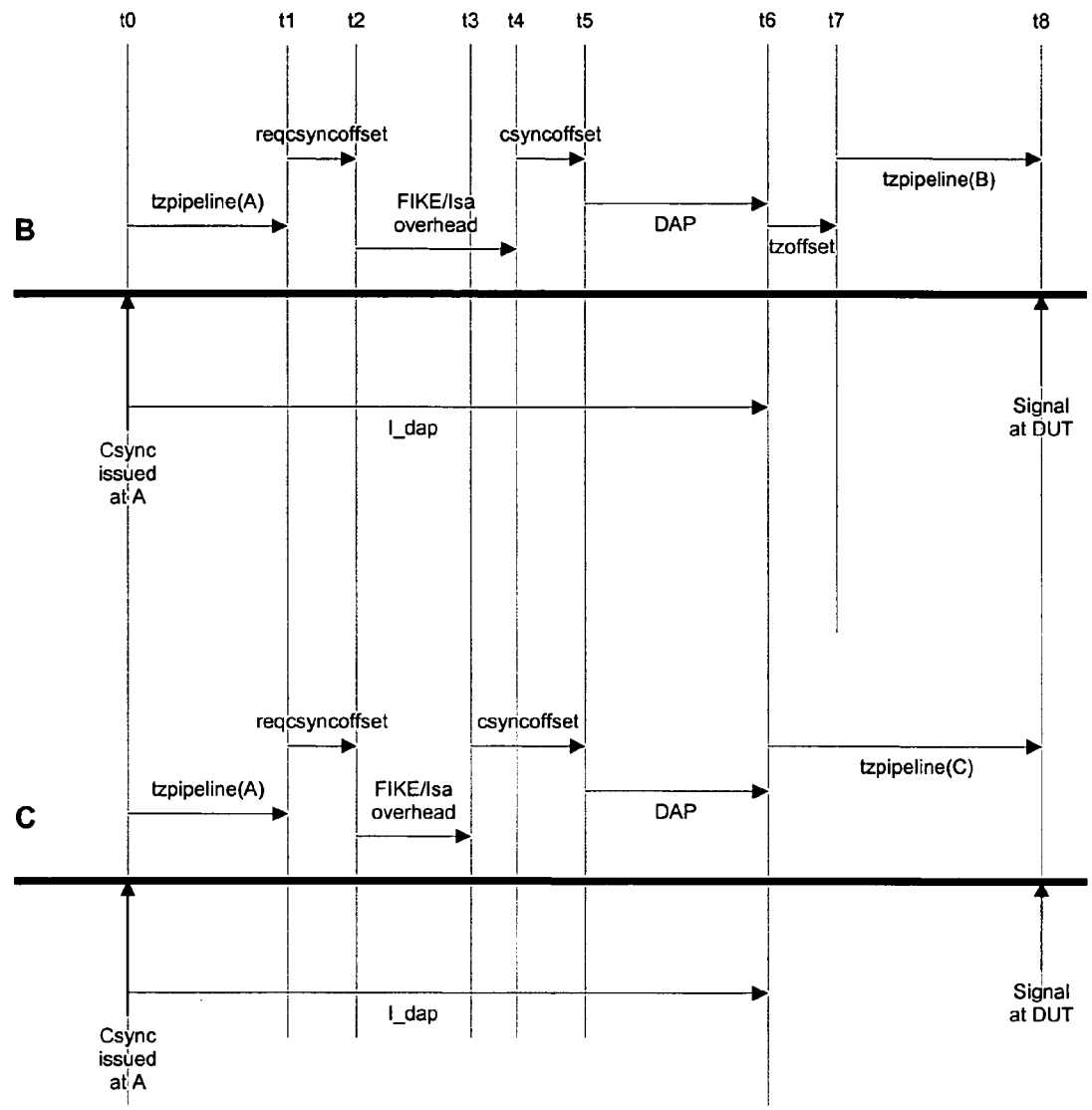
FIG. 4 illustrates timing diagrams of sync messages generated in response to a programmed event.
Figure 5:
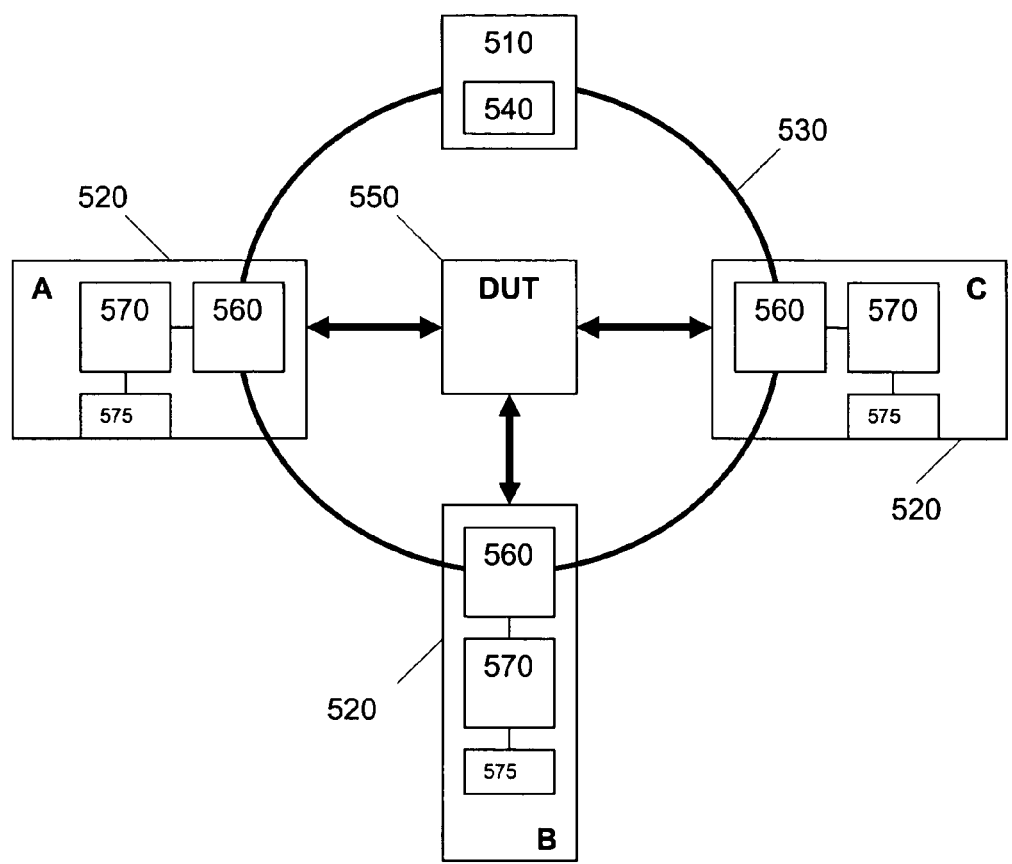
FIG. 5 is a block diagram showing a test system according to an embodiment of the invention.

FIG. 4 illustrate timing diagrams for a sync message generated by instrument A that appears at two different instruments, instrument B and instrument C. Each of the instruments A, B, C includes a bus interface FPGA 560 and a sequencer FPGA 570 as shown in FIG. 5. The sequencer FPGA 570 executes a sequence of instructions, one instruction per test period (Tz). The test period corresponds to the test period of the DUT pin or pins on which the instrument is performing tests. This test period may differ from instrument to instrument and are referred to below as TzA, TzB and TzC.

The test instructions executed by the sequencer FPGA 570 are stored in a dual inline memory module (DIMM) 575. The sequencer FPGA 570 executes the test instructions in sequence, one test pattern per test period, until it goes into a loop known as a wait until sync (WUS) loop or a call until sync (CUS) loop. The WUS or CUS loop is exited when the sequencer FPGA 570 receives a sync message of a certain type that it is looking for. When the sequencer FPGA 570 is in the WUS loop, it does not execute instructions and looks for the sync message of the certain type. When the sequencer FPGA 570 is in the CUS loop, it calls and executes a series of instructions until it receives a sync message of the certain type.

The timing diagrams shown in FIG. 4 indicate a sync message issued at t=t0. The test program specifies when this sync message is to be generated, what instrument is to generate this sync message, and what and when instrument or instruments are to use this sync message (e.g., for triggering a sequence of instructions to be executed).

In the example corresponding to the timing diagrams of FIG. 4, instrument A is to issue the sync message at t=t0 and at some time (I_dap) later, instruments B and C are to execute a series of instructions concurrently when this sync message is received. To accomplish this, the sequencer FPGA 570 of instrument B and C is instructed to execute a WUS loop (or CUS loop) some time after t=t0 until it receives the sync message issued by instrument A.

The delays shown in FIG. 4 include actual delays from processing and transmission and adjustable (offset) delays that are applied to the sync message as it travels from instrument A to each of the instruments B and C. The delay, tzpipeline(A), is an actual delay. It represents the pipeline delay of the sequencer FPGA 570 of instrument A. The delay, FIKE/Is a overhead, is also an actual delay. It represents the actual delay in the signal traveling from the sequencer pipeline output of instrument A to the sequencer pipeline input of instrument B or C. The delays, reqcsyncoffset and csyncoffset, are offset delays that are introduced to ensure that the sync message arrives at the sequencer pipeline inputs of instruments B and C at the same time.

In order for instruments B and C to exit their respective WUS loops at t=t6, the delay, DAP, needs to be introduced, where DAP=I_dap−(tzpipeline(A)+reqcsyncoffset+FIKE/Isa overhead+csyncoffset). The DAP delay is applied to the sync message as a number of additional Tz periods (n_dap). Therefore, the n_dap value will be different in the example of FIG. 4 if instruments B and C have different Tz periods.

The DAP delay ensures that instruments B and C exit their respective WUS loops at the same time (t=t6), but this does not ensure that test data generated by instruments B and C upon their execution of the instructions appearing after the WUS loop arrive at the DUT at the same time. The reason for this is the sequencer pipeline delay differences between the two instruments. To account for this difference, an additional offset delay, tzoffset, is introduced. This delay is calculated based on the following equation: tzoffset=(maximum sequencer pipeline delay for all instruments−sequencer pipeline delay for current instrument).

Even with the DAP delay and the tzoffset delay, when the Tz period for instruments B and C are different, data might still arrive at the DUT from instruments B and C at different times. This would happen when data from instrument B arrives at the DUT during the middle of a Tz period for C. To ensure that data from instruments B and C arrive at the DUT at the beginning of their respective Tz periods, an additional delay, RC, is introduced. The RC delays for the two instruments, defined in terms of their respective periods, TzB and TzC, are calculated in the following manner:

If Counter($B$)>0, RC for $B$=($Icm/TzC$−Counter($B$))
  *$Icm$; otherwise RC for $B$=0;

If Counter($C$)>0, RC for $C$=($cm/TzB$−Counter($C$))
  *$Icm$; otherwise RC for $C$=0;

where:
Icm=lowest common multiple of TzB and TzC;
Counter(B) is a 0 to (Icm/TzC−1) counter that increments at each TzB period; and
Counter(C) is a 0 to (Icm/TzB−1) counter that increments at each TzC period.

When the tz periods for instruments B and C are different, the tzoffset delay is calculated in a different manner:

tzoffset=(sync_exec_dly/$Tz$ for current instrument)−
  number of pipe stages for current instrument, where:
Icm=lowest common multiple of TzB and TzC;
sync_exec_dly=max_pipeline_dly modulo Icm; and
max_pipeline_dly=maximum sequencer pipeline delay for all instruments.

Figure 6:
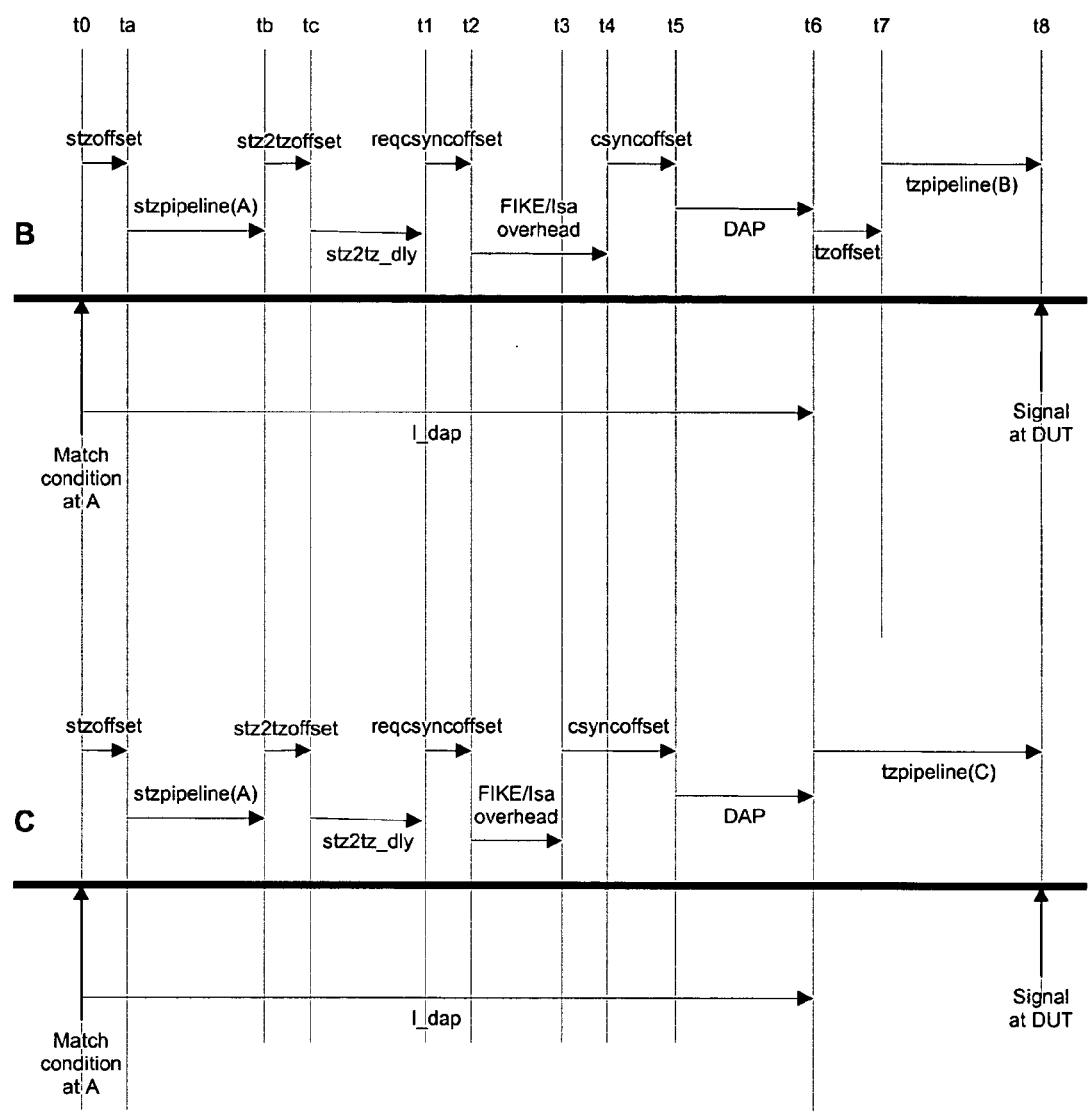
FIG. 6 illustrates timing diagrams of sync messages generated in response to a detected event.

The test program may condition a triggering of a sequence of instructions at an instrument based on an event detected at the DUT by another instrument. FIG. 6 illustrates timing diagrams for a sync message generated by test instrument A, in response to an event detected at the DUT by instrument A, that appears at two different instruments, instrument B and instrument C. These timing diagrams are identical to the timing diagrams of FIG. 4 for t=t1 through t=t7.

Between t=t0 and t=t1, the delays, stzpipeline(A) and stzoffset, are shown. They represent the amount of time taken for an event detected at the DUT pin that is being tested by instrument A to reach the output of the sequencer pipeline of instrument A. The number of pipe stages for signals traveling from the sequencer FPGA 570 to the DUT (Tz pipeline) can be different from the number of pipe stages for signals traveling from the DUT to the sequencer FPGA 570 (STz pipeline). The delay, stzpipeline(A), represents the sequencer pipeline delay for signals traveling from the DUT to the instrument A. This delay differs from instrument to instrument. To ensure that all instruments exhibit the same sequencer pipeline delay for signals traveling from the DUT to the instrument, an offset delay, stzoffset, is provided. The offset delay, stzoffset, is calculated based on the following formula: stzoffset=(maximum STz pipeline delay for all instruments−STz pipeline delay for current instrument).

When the STz period for instruments B and C are different, the stzoffset delay is calculated in a different manner:

stzoffset=(sync_rec_dly/$STz$ for current instrument)−
  number of $STz$ pipe stages for current instrument, where:
Icm=lowest common multiple of STzB and STzC;
sync_rec_dly=max_pipeline_dly modulo Icm; and
max_pipeline_dly=maximum STz pipeline delay for all instruments.

The delays, stz2tz$_{dly}$ and stz2tzoffset, are also shown in FIG. 6 between t=t0 and t=t1. They represent the output response delay of the DUT to test signals that are applied to the DUT input, and are necessary for the conversion from the DUT output time domain (with respect to which the event is detected) to the DUT input time domain. The delay, $stz2tz_{\_dly}$, represents the actual DUT output response delay. Since this delay differs from instrument to instrument, an offset delay, stz2tzoffset, is provided. The offset delay, stz2tzoffset, is calculated based on the following formula: stz2tzoffset=(maximum $stz2tz_{\_dly}$ delay for all instruments−$stz2tz_{\_dly}$ delay for current instrument).

Figure 7:
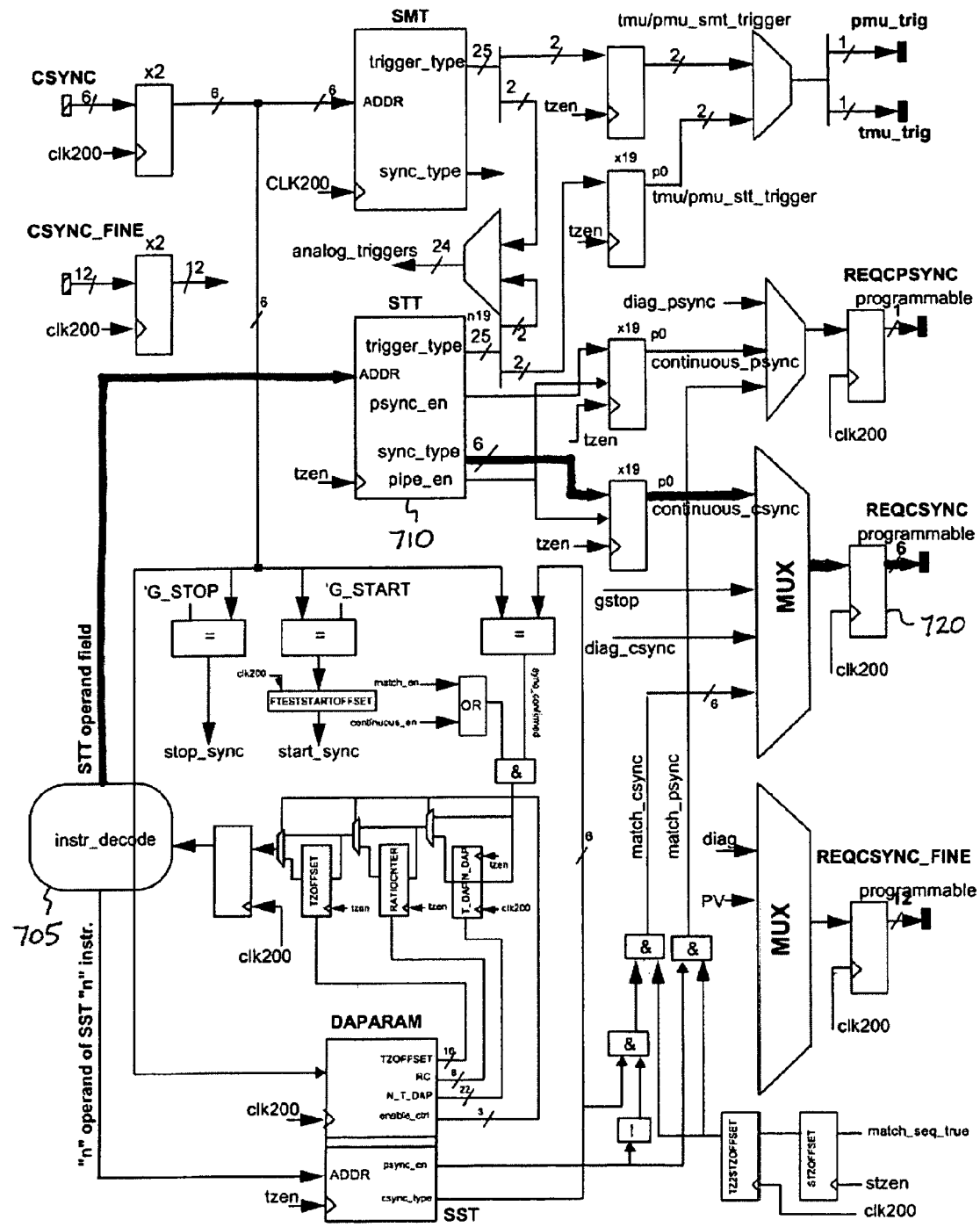
FIG. 7 is a block diagram of a sequencer FPGA showing the generation of a sync message in response to a programmed event.

FIG. 7 is a block diagram of a sequencer FPGA of a test instrument that illustrates the delays that are added to a request to generate a sync message in response to a programmed event. The thick arrows indicate the flow of signals that result in a request to generate a sync message. The request is made pursuant to certain events specified in the test program and is initiated from an instruction decode (instr_decode) section 705. The request includes a sync message type (sync_type) that is retrieved from a table and added in block 710. The delay, reqcsyncoffset, is introduced in block 720.

Figure 8:
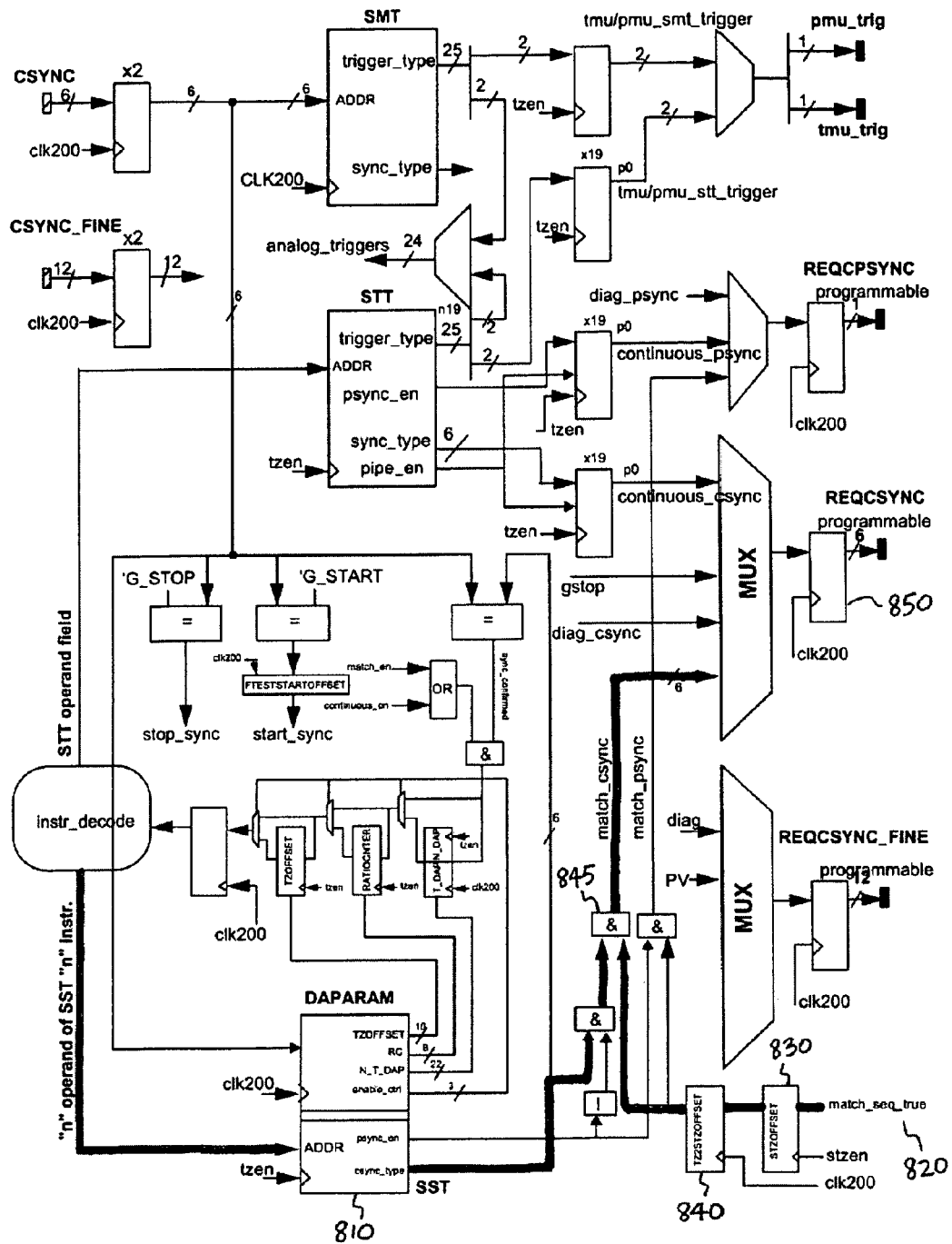
FIG. 8 is a block diagram of a sequencer FPGA showing the generation of a sync message in response to a detected event.

FIG. 8 is a block diagram of a sequencer FPGA of a test instrument that illustrates the delays that are added to a request to generate a sync message in response to a detected event. The thick arrows indicate the flow of signals that result in a request to generate a sync message. The request is made pursuant to a certain event detected at the DUT output and is initiated when a match flag (match_seq_true) 820 is TRUE. The delays, stzoffset and stz2tzoffset, are introduced in blocks 830 and 840, respectively. When the match flag=TRUE signal arrives at block 845, the sync message type (csync_type) retrieved from a table in block 810 is included in the request. The delay, reqcsyncoffset, is introduced in block 850.

Figure 9:
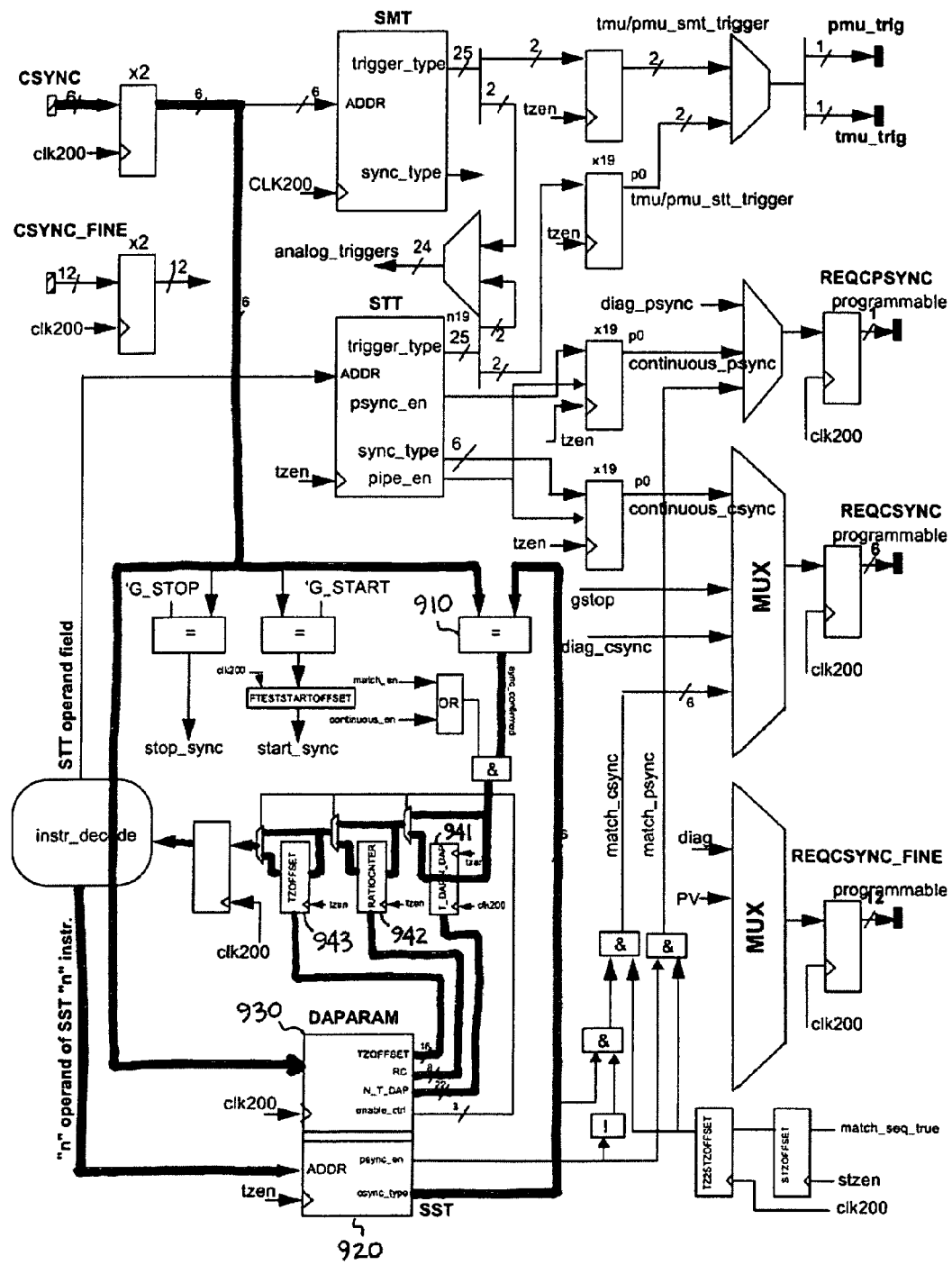
FIG. 9 is a block diagram of a sequencer FPGA showing the application of delays to a sync message.

FIG. 9 is a block diagram of a sequencer FPGA of a test instrument that illustrates the delays that are added to a sync message received by the sequencer FPGA. The thick arrows indicate the flow of the sync message. In block 910, the sync message is received and compared with a sync message type (csync_type) that the sequencer FPGA is waiting for. The sync message type is retrieved from a table in block 920 based on the test program. If there is a match, the sync message is delayed in series by a DAP delay value 941, an RC delay value 942, and a tzoffset delay value 943 retrieved from table 930. The DAP delay value 941, the RC delay value 942, and the tzoffset delay value 943 are calculated based on the formulas given above and stored in the table 930.

While the foregoing is directed to embodiments of the present invention, other and further embodiments of the invention may be devised without departing from the basic scope thereof, and the scope thereof is determined by the claims that follow.

What is claimed is:

1. An apparatus having a plurality of test modules connected to a bus for testing an electronic device and responsive to a trigger transmitted on the bus, comprising:
   a first test module having a programmable device programmed to execute a test sequence that includes a conditional part that is not executed until the trigger is received and to delay the execution of the conditional part after the trigger is received by a first delay amount;
   a second test module having a programmable device programmed to execute a test sequence that includes a conditional part that is not executed until the trigger is received and to delay the execution of the conditional part after the trigger is received by a second delay amount; and
   a third test module having a programmable device programmed to issue a request to transmit the trigger on the bus.

2. The apparatus according to claim 1, wherein the first delay amount is larger than a second delay amount by an amount that is equal to a difference in pipeline delays of the programmable devices.

3. The apparatus according to claim 1, wherein the test sequences executed by the programmable devices have different test periods.

4. The apparatus according to claim 3, wherein test signals generated by the first test module upon execution of the conditional part and test signals generated by the second test module upon execution of the condition part arrive at the electronic device at the same time and at the beginning of their respective test periods.

5. The apparatus according to claim 4, wherein each of the programmable devices includes a counter based on which the first delay amount and the second delay amount are adjusted.

6. The apparatus according to claim 1, wherein the programmable device of the third test module is further programmed to execute a test sequence and the request to transmit the trigger on the bus is issued when test signals generated upon execution of the test sequence arrive at the electronic device.

7. The apparatus according to claim 1, wherein the programmable device of the third test module is further programmed to strobe response signals from the electronic device and the request to transmit the trigger on the bus is issued when a predetermined event is detected in the response signals from the electronic device.

8. A test instrument for a test apparatus having a plurality of test instruments that are synchronized to a global clock and connected to a bus, comprising:
   a first programmable device interfaced with the bus; and
   a second programmable device coupled with the first programmable device and to a device under test, the second programmable device being programmed to execute a test sequence in response to a trigger at a rate equal to a clock speed of the device under test and to delay the trigger by a first delay amount that is defined with respect to the clock speed of the device under test,
   wherein the first programmable device is programmed to pass on a tripper appearing on the bus to the second programmable device and to delay the passing of the trigger by a second delay amount that is defined with respect to the global clock speed.

9. The test instrument according to claim 8, wherein the first delay amount is defined as the number of clock periods of the device under test.

10. The test instrument according to claim 8, wherein the second programmable device is further programmed to issue a request for transmission of a trigger onto the bus and to delay the request by a third delay amount that is defined with respect to the global clock speed.

11. The test instrument according to claim 10, wherein the third delay amount is an offset value equal to a predetermined base delay minus an actual delay corresponding to hardware overhead related to providing the trigger request to the first programmable device.

12. The test instrument according to claim 8, wherein the second delay amount is an offset value equal to a predetermined base delay minus an actual delay corresponding to hardware overhead related to receiving the trigger from the first programmable device.

13. A method of synchronizing the execution of test patterns by first and second test instruments during testing of an electronic device, comprising the steps of:
  initiating an instruction loop in both instruments;
  receiving at both instruments a trigger to exit the instruction loop;
  delaying the trigger by a first delay amount in the first test instrument and by a second delay amount in the second test instrument;
  exiting the instruction loop in the first test instrument after the first delay amount and exiting the instruction loop in the second test instrument after the second delay amount;
  executing the test patterns to generate test signals at the first and second test instruments; and
  supplying the test signals generated at the first test instrument to the input of the electronic device and the test signals generated at the second test instrument to the input of the electronic device.

14. The method according to claim 13, wherein the first delay amount is larger than a second delay amount by an amount that Is equal to a difference in pipeline delays of the two test instruments.

15. The method according to claim 13, wherein the test signals generated at the first and second test instruments have different test periods.

16. The method according to claim 15, wherein the test signals generated at the first test instrument and the test signals generated at the second test instrument are supplied to the input of the electronic device at the same time and at the beginning of their respective periods.

17. The method according to claim 13, wherein the instruction loop comprises a wait for trigger instruction.

18. The method according to claim 13, wherein the instruction loop comprises a series of instructions that are executed.

* * * * *